United States Patent
Yao et al.

(10) Patent No.: US 7,777,338 B2
(45) Date of Patent: Aug. 17, 2010

(54) SEAL RING STRUCTURE FOR INTEGRATED CIRCUIT CHIPS

(75) Inventors: Chih-Hsiang Yao, Taipei (TW);
Tai-Chun Huang, Hsinchu (TW);
Kuan-Shou Chi, Hsin-Chu (TW);
Chih-Cherng Jeng, Hsin-Chu (TW);
Ming-Shuoh Liang, Hsin-Chu (TW);
Wen-Kai Wan, Hsin-Chu (TW);
Chin-Chiu Hsia, Taipei (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 10/940,504

(22) Filed: Sep. 13, 2004

(65) Prior Publication Data

US 2006/0055007 A1     Mar. 16, 2006

(51) Int. Cl.
*H01L 23/48* (2006.01)
(52) U.S. Cl. .................. 257/758; 257/700; 257/E23.17
(58) Field of Classification Search ............ 257/E23.17, 257/700, 758
See application file for complete search history.

(56) References Cited

U.S. PATENT DOCUMENTS

| | | | | |
|---|---|---|---|---|
| 6,861,755 B2* | 3/2005 | Hosoda et al. | .............. | 257/758 |
| 6,998,712 B2* | 2/2006 | Okada et al. | ................. | 257/758 |
| 7,138,700 B2* | 11/2006 | Tomita et al. | ................ | 257/529 |
| 2002/0009791 A1* | 1/2002 | Fujii et al. | ................... | 435/202 |
| 2003/0227089 A1* | 12/2003 | Watanabe et al. | ........... | 257/758 |
| 2004/0002198 A1 | 1/2004 | Lee et al. | ..................... | 438/460 |
| 2004/0130035 A1 | 7/2004 | Wu et al. | ..................... | 257/774 |
| 2004/0173824 A1 | 9/2004 | Nagasaki et al. | ............ | 257/255 |

FOREIGN PATENT DOCUMENTS

| | | |
|---|---|---|
| JP | 200-277465 | 10/2000 |
| TW | 517335 | 1/2003 |

OTHER PUBLICATIONS

Australian Patent Office Written Opinion, Oct. 8, 2008.
Australian Patent Office Written Opinion, Apr. 10, 2008.

* cited by examiner

*Primary Examiner*—Lex Malsawma
(74) *Attorney, Agent, or Firm*—K&L Gates LLP (57) ABSTRACT

A seal ring structure is disclosed for protecting a core circuit region of an integrated circuit chip. The seal ring structure includes a metallization layer, having a bridge sublevel and a plug sublevel. An upper-level bridge is formed on the bridge sublevel at a predetermined location between a peripheral edge of the integrated circuit chip and the core circuit region. A lower-level bridge is formed on the plug sublevel in substantial alignment with the upper-level bridge, wherein the lower-level bridge has a width substantially the same as that of the upper-level bridge.

50 Claims, 9 Drawing Sheets

SEAL RING STRUCTURE FOR INTEGRATED CIRCUIT CHIPS

BACKGROUND

The present invention relates generally to semiconductor integrated circuit (IC) chip designs, and more particularly to a mechanically strong seal ring structure that can limit and stop the advance of unintended cracks from the corner and edge of an IC chip.

IC chips are constructed in rectangular arrays on a round single crystal wafer. Most wafers are made of silicon. The chips are separated by scribing and breaking, stress breaking, or, most typically, sawing. The separation lines are aligned along selected crystal axes, such that the separation proceeds in an orderly and predictable manner. However, unintended stress cracks are inevitably produced by the separation processes. Such cracks are most numerous near the corners of a chip where two perpendicular separation lines meet. Such cracks also advance along crystal axes. Because of the crystal orientation that is most propitious for chip production, unintended cracks are seen to begin perpendicularly to the chip edge.

The sharp end of a crack concentrates disruptive energy that is directed to advance the crack. This is a dangerous and undesirable situation in any material. Of course, such a crack can advance unpredictably into the core circuitry of the chip and destroy it when silicon structures, dielectric layers, metal wiring layers, and other structures are disrupted. Such cracks are also conduits for the introduction of destructive contaminants.

When the chip is encapsulated in a metal, ceramic, or plastic package, further stresses that can cause cracks are produced. Once initiated, these cracks follow the same progression as those from chip separation.

When integrated circuit chips are separated by any means, there is always a possibility of initiating micro-cracks from the edges, especially near the corners. Encapsulation can also initiate cracks. By nature, cracks tend to advance. A crack that progresses into the core circuitry of an IC is likely to cause failure. A structural seal ring between the core circuitry and the edges of the IC chip is typically constructed on the chip simultaneously with the construction of the core circuitry. The intended purpose of the seal ring is to limit the intrusion of any cracks into the vital interior core circuitry. Also, the seal ring can prevent moisture penetration or chemical damage like acid, alkaline containing or diffusion of contaminating species. As critical geometries of ICs continue to grow smaller with each technology generation, the scale and distribution of inherent stresses increase, and the problem of cracks becomes more significant. To limit and stop the cracks, a seal ring structure is installed around the active face of the IC chip during production, using a combination of surface topology, and layers of dielectric and metal patterns. Each new technology generation is likely to require a new approach to seal ring designs. As such, the provision of a protective seal ring becomes more critical and complex.

In current multilevel metal assemblies, a damascene or dual damascene approach is used for producing a seal ring structure. Each layer of metallization is composed of two sublevels. The lower sublevel is an arrangement of plugs that fill etched vias in a core circuitry region. The upper sublevel is an arrangement of bridges that fill etched trenches and connect through the plugs to lower metal lines or semiconductor structures. In this kind of seal ring, the total structure is not sufficiently resistant to the intrusion of cracks, and especially weak is the sublevel plugs.

Desirable in the art of seal ring structure are designs that can better limit and stop the advance of cracks from the edge of an IC chip.

SUMMARY

In view of the foregoing, the invention discloses a seal ring structure for protecting a core circuit region of an integrated circuit chip. In one embodiment of the invention, the seal ring structure includes a metallization layer, having a bridge sublevel and a plug sublevel. A bridge is disposed on the bridge sublevel at a predetermined location between a peripheral edge of the integrated circuit chip and the core circuit region. A plug is disposed on the plug sublevel in substantial alignment with the bridge, wherein the plug has a width substantially the same as that of the bridge.

The construction and method of operation of the invention, however, together with additional objects and advantages thereof will be best understood from the following description of specific embodiments when read in connection with the accompanying drawings.

DESCRIPTION

The present invention discloses a mechanically strong seal ring structure involving several levels of metallization that can better limit and stop the advance of cracks. The mechanically strong seal ring structure has a more massive structure in an area between a core circuitry and an edge of an IC chip. The structure is a stack of upper-level bridges and lower-level bridges. Greater mass and strength are achieved to offer improved resistance to the intrusion of cracks.

A typical failure mode that can be experienced by an integrated circuit (IC) is the initiation and progression of a stress crack from an edge of an IC chip. The damage that can be caused by such an advancing crack is illustrated in a partially enlarged cross-section view 100 of a chip in FIG. 1A. An initial micro-crack 102 may be produced by external stress during chip separation or during encapsulation. The crack progresses across the chip and its dielectric coating layers 104. When the advancing crack encounters a metallization line, such as a copper line 106, the crack may progress both laterally beside the metal line as shear cracks 108 and also directly across the metal line as crack 110. From the shear cracks 108, the initial micro-crack 102 may progress in the original direction as a crack 112. Further shear and direct cracks may be generated.

Figure 1A:
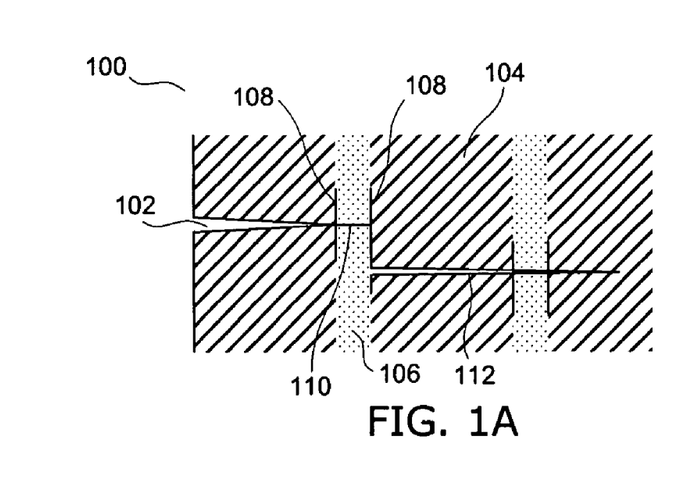
FIGS. 1A-1C illustrate cracks intruding from an edge of an IC chip into its interior region.
Figure 1B:
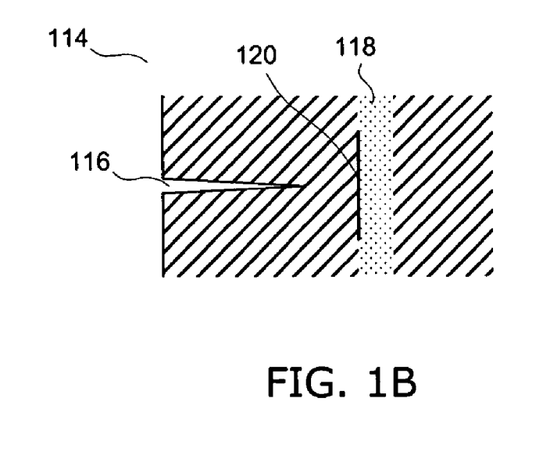

FIG. 1B illustrates a partially enlarged cross-section view 114 of a chip, which contains an initial micro-crack 116. Even though the initial micro-crack 116 has not progressed to the metal line 118, stresses concentrated at the sharp tip of the advancing crack can produce a shear crack 120 beside the metal line 118.

Figure 1C:
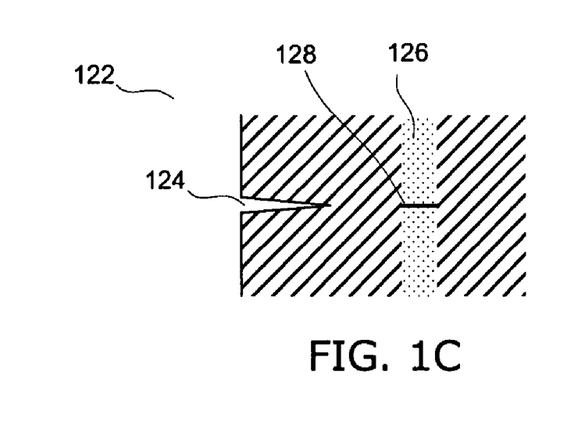

FIG. 1C illustrates a partially enlarged cross-section view 122 of a chip, which contains an initial micro-crack 124. Even though the initial micro-crack 124 has not progressed to the metal line 126, stresses concentrated at the sharp tip of the advancing crack can produce a direct crack 128 across the metal line 126.

If such cracks progress into the core circuitry of the IC, the circuit functionality may fail. The standard line of protection to prevent this is a seal ring placed between the edge of the chip and the interior core circuitry. The seal ring typically includes metal structures that are constructed simultaneously with the standard metal structures in the core circuitry.

As device geometries become smaller, damascene or dual damascene structures are often employed as seal rings. Global planarization schemes, such as chemical-mechanical-polish (CMP) and etch back, provide extremely flat surfaces at every metal level for successful photolithography, even with the extremely shallow depth of focus available. In a typical damascene structure, each metal level is actually doubled. The lower sublevel is composed of metal plugs that fill vias formed in a first dielectric layer and a barrier layer. The lower sublevel is covered by a second dielectric layer. In one embodiment, the lower sublevel is covered with also an etch stop layer (ESL) and the second dielectric layer. A trench is etched in the upper sublevel made of the second dielectric layer. In one embodiment, the trench is etched in the sublevel made of the second dielectric layer and the etch stop layer. The trench is filled with metal, by any of several techniques, to form the second sublevel of metal. Excess metal is polished back down to the dielectric layer, leaving only the metal in the trench. The metal, in the trench, bridges between plugs and connects to some metal lines crossing underneath therethrough. Trench etch and via etch may occur in a reverse order, allowing a single metal deposition. Examples of metals that may be used include aluminum containing, tungsten containing, or copper containing material.

Figure 2:
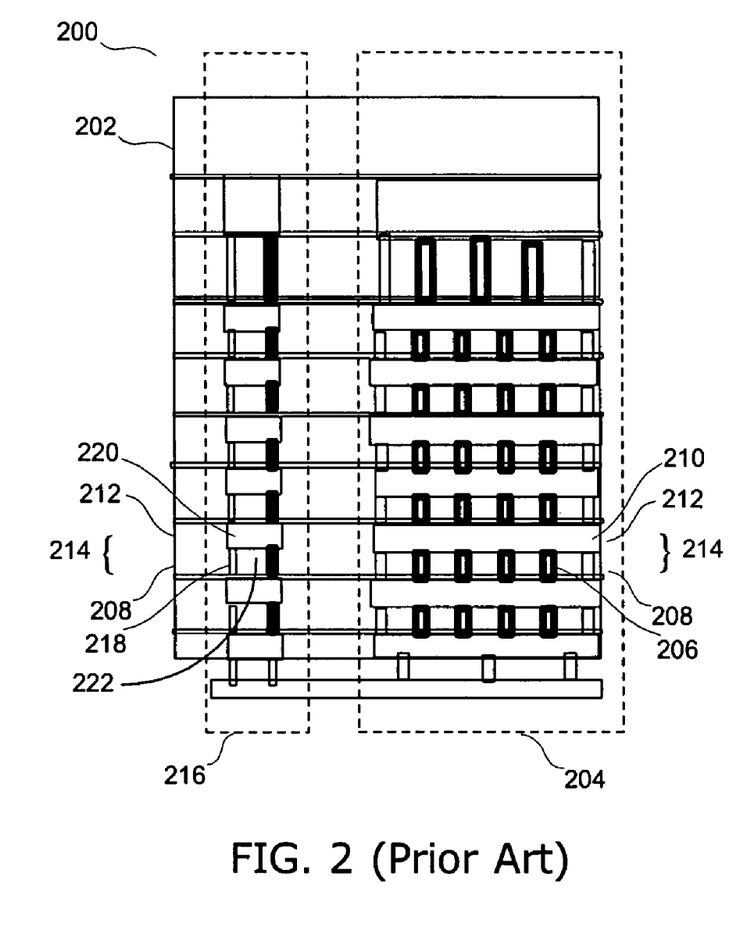
FIG. 2 illustrates a cross section of a conventional seal ring structure.
Figure 2A:
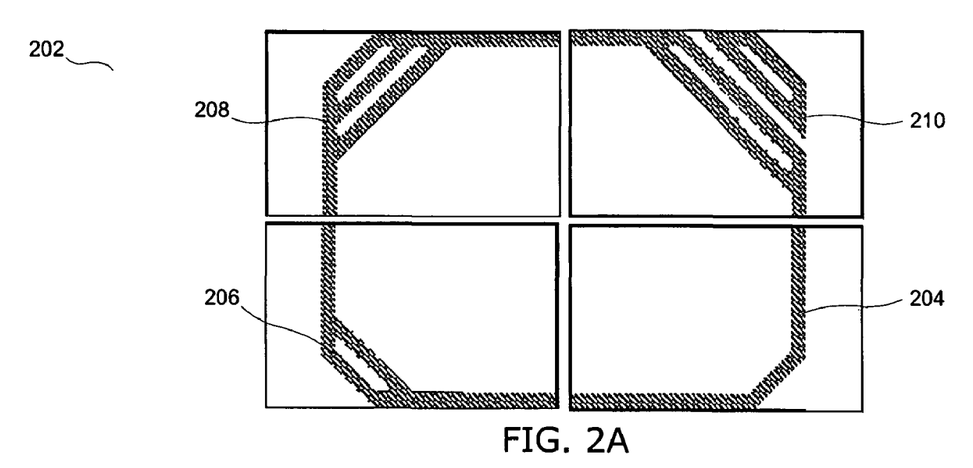
Figure 2B:
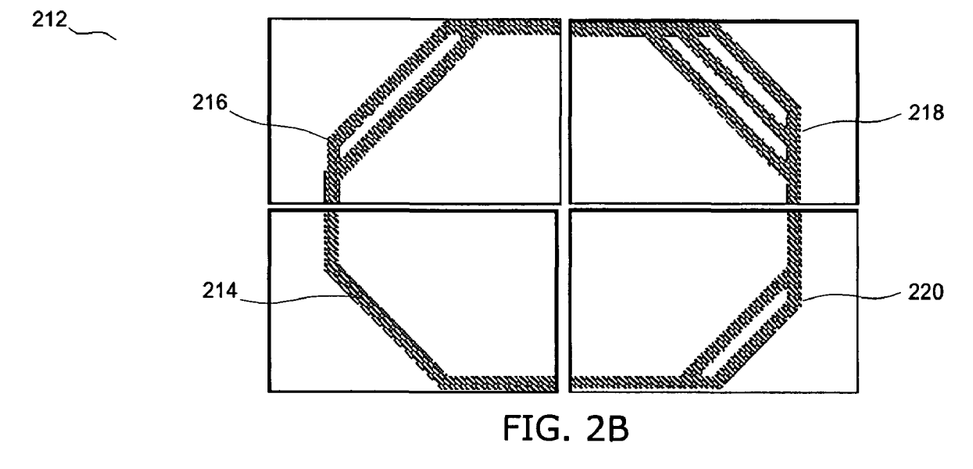
Figure 2C:
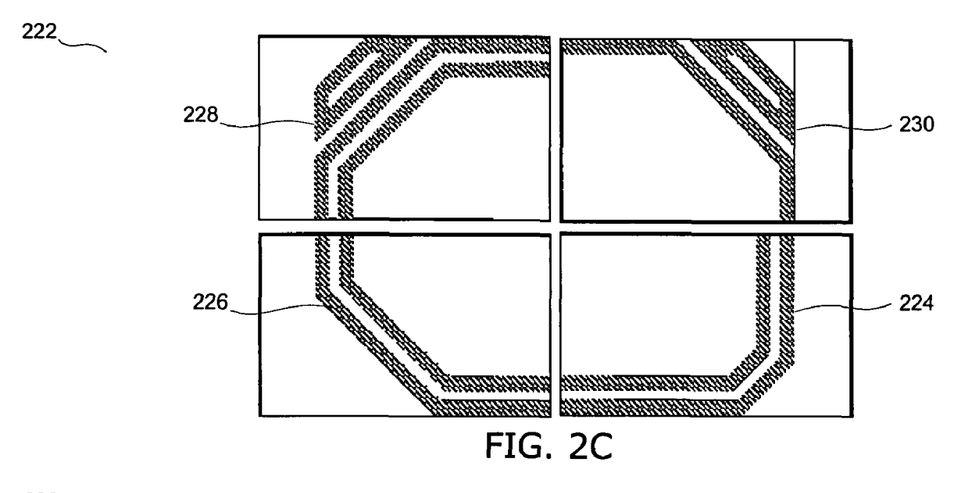
Figure 2D:
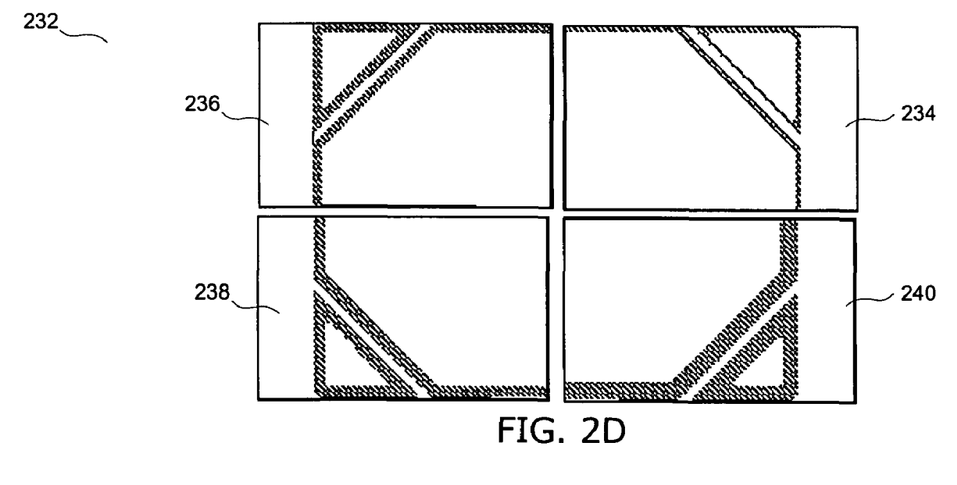

FIG. 2 illustrates a conventional damascene structure used as a seal ring that is susceptible to the advancing micro-crack damages as shown in FIGS. 1A-1C. A cross section 200 shows an entire multilevel-metal stack. A vertical chip edge 202 is produced during chip processing or chip separation. A column 204 illustrates metallization for the core circuitry with six plugs 206 in a plug sublevel 208 and one bridge 210 in each bridge sublevel 212, at each level of metal 214. A column 216 illustrates the metallization for the seal ring with two plugs 218 in the plug sublevel 208 and one bridge 220 in each bridge sublevel 212, at each level of metal 214. the two plugs 218 in the plug sublevel 208 are isolated by a dielectric structure 222. The metallization for the seal ring may include more than two plugs in the plug sublevel and one bridge in each bridge sublevel, at each level of metal. The more than two plugs in the plug sublevel are also isolated by dielectric layer. The metallization for the seal ring may also includes more than one bridge in each bridge level, at each level of metal. An exemplary level of metal 214, for both the core circuitry 204 and the seal ring 216, is constructed of the plug sublevel 208 and the bridge sublevel 212. In the seal ring, it is the plug 218 in the plug sublevel 208 that is most susceptible to damage from advancing micro-cracks. In the plug sublevel, the plugs 218 are more susceptible to damage from advancing micro-cracks. The width of a plug 218 is rather narrow and is relatively narrower than the width of the dielectric layer. The width of plugs 218 is much narrower than that of the bridge 220 in the bridge sublevel 212 of a seal ring. Since the dielectric has less resistance to advancing micro-cracks. It has, therefore, considerably less adhesive strength to the upper and lower levels of metal than does the bridge 220. Therefore, the resistance of the plug sublevel 208 to crack invasion is relatively low.

Figure 3A:
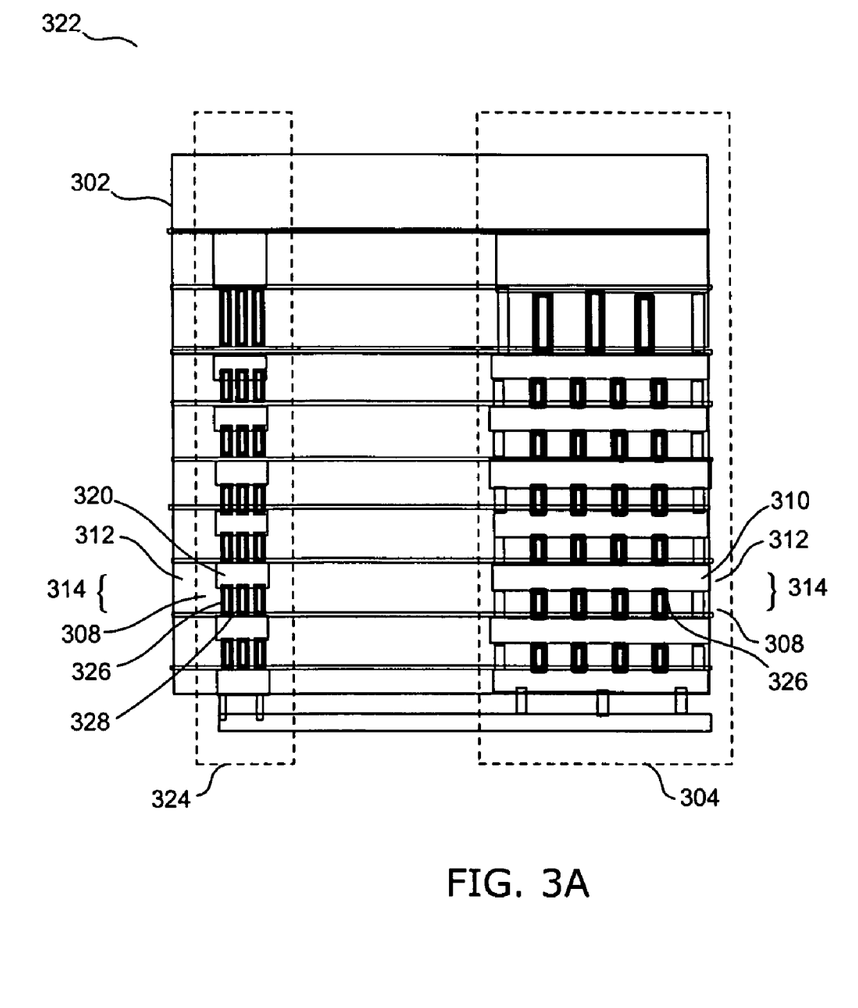
FIGS. 3A-3C illustrate cross sections of a mechanically strong seal ring structure involving several levels of metallization, in accordance with various embodiments of the present invention.
Figure 3B:
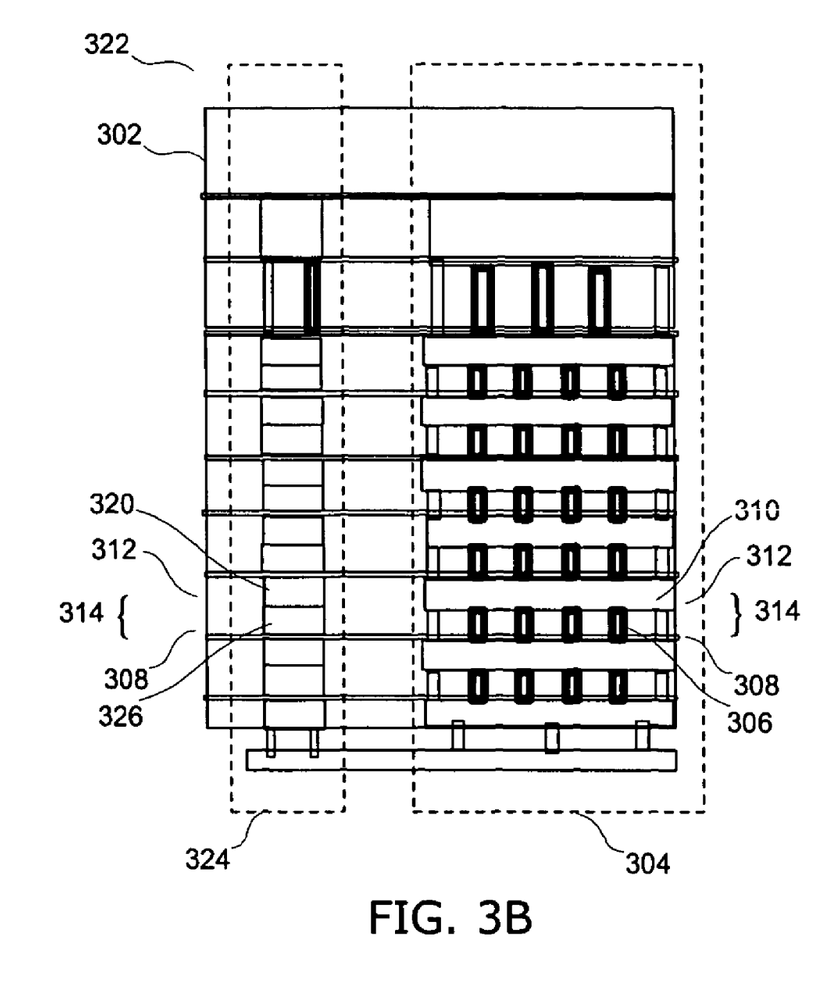
Figure 3C:
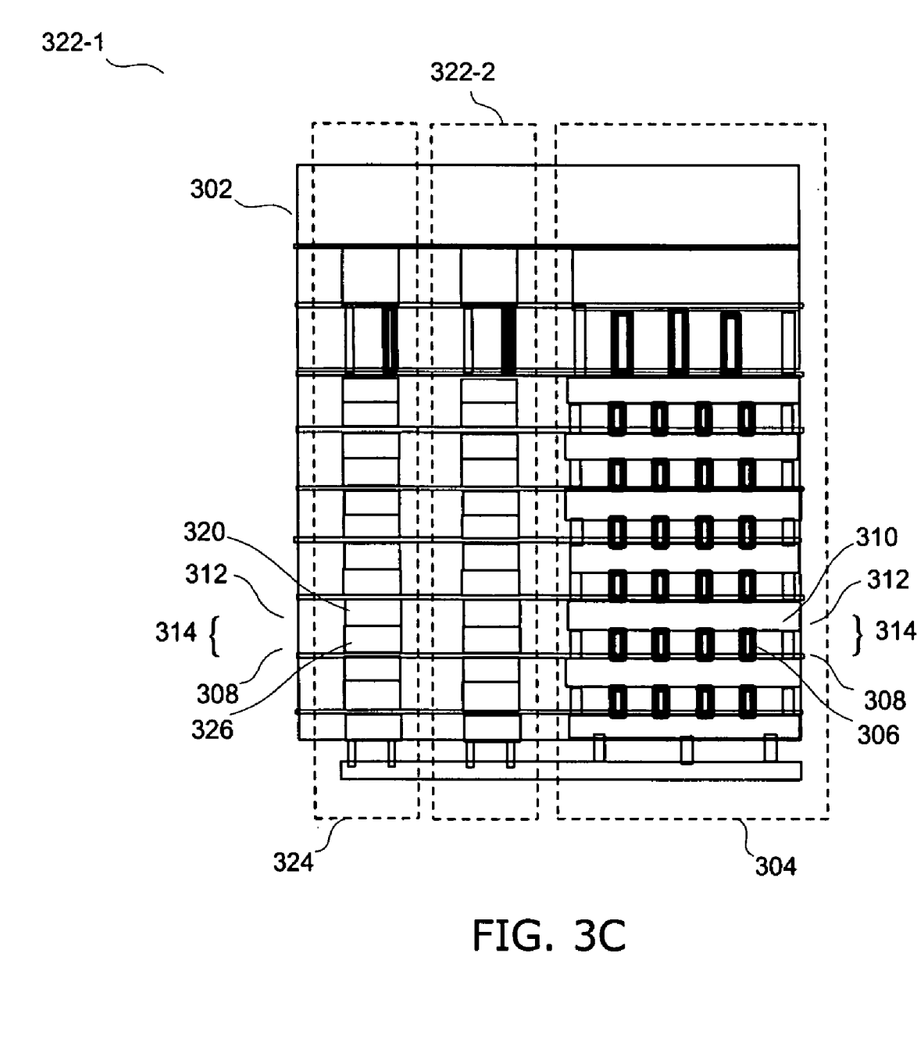

A more durable seal ring structure is presented in one embodiment of the present invention. A mechanically strong seal ring can be constructed, if the plug in the plug sublevel is expanded to a width substantially similar to the width of the dielectric structure at the plug sublevel. Consequently, the total widths of the plugs in the plug sublevel are extended to substantial 50% of the width of the bridge in the bridge sublevel. FIGS. 3A-3C illustrate various embodiments of the present invention, in which like numerals represent like structural components. FIG. 3A illustrates a cross section 322 of an entire multilevel-metal stack, which includes a mechanically strong seal ring structure 324. A vertical chip edge 302 is produced during chip processing or chip separation. A column 304 illustrates metallization for the core circuitry with six plugs 306 in the plug sublevel 308 and one bridge 310 in each bridge sublevel 312, at each level of metal 314. The mechanically strong seal ring structure 324 illustrates metallization for the seal ring with 3 plugs 326 in the plug sublevel 308 and one bridge 320 in each bridge sublevel 312, at each level of metal 314. The plugs 326 are isolated by dielectric structures 328. The widths of the plugs 326 are substantially similar to the widths of the dielectric structures 328. Consequently, the total width of the plugs 326 in the plug sublevel 308 is more than 50% of the width of the bridge 320 in the bridge sublevel 312. Preferably, as another embodiment shown in FIG. 3B, the total width of the plugs 328 in the plug sublevel 308 is substantially the same as the width of the bridge 320 in the bridge sublevel 312. The number of plugs in plug sublevel may be the same or different from the number of bridges in bridge sublevel depend on the design of seal ring. As shown in FIG. 3A, three plugs 326 correspond to one bridge 320 at each level of metal 314.

FIG. 3B shows another embodiment, wherein one plug 326 in the plug sublevel 308 corresponds to one bridge 320 in the bridge sublevel 320. The number of plugs and bridges may vary, depending on the width of plugs, to optimize the strength of the seal ring against advance of cracks. In another embodiment, the mechanically strong seal ring may contain more than one metallization regions, as illustrated in FIG. 3C, in which 2 metallization regions 322-1 and 322-2 constitute a stronger seal ring structure. In another embodiment, the mechanically strong seal ring may contain metallization with more than one bridge in the bridge sublevel to perform a more strong seal ring structure.

An exemplary fabrication process of the above-described seal rings is briefly explained as the following. The level of metal 314 is constructed simultaneously for both the core circuitry 304 and the mechanically strong seal ring structure 324. The vias for the plugs 306 and a trench for the lower-level bridge 326 are formed simultaneously. Metal is deposited into both the vias and the lower-level trench. The lower-level bridge 326 in the plug sublevel 308 is substantially aligned with the bridge 320 in the bridge sublevel 312. In one embodiment, an etch stop layer (not shown in FIG. 3A) may be formed between the bridge sublevel 312 and the lower plug sublevel 308.

The dielectric structures 328 may contain low dielectric constant (low K) dielectric material, that usually have a dielectric constant lower than 3.0. These low K dielectric materials may be a nitrogen containing, carbon containing, silicon containing or oxygen containing material. The low K dielectric material may be also a porous material or a doped material, such as a doped silicon glass. The dielectric structures may be formed by a CVD, LPCVD, PECVD, HDP or Spin-On process. The underlying barrier layer and the overlying barrier layer and the etch stop layer may contain nitrogen, carbon, silicon, oxygen or a combination thereof. The underlying barrier layer, the overlying barrier layer and the etch stop layer may be formed by a CVD, LPCVD, PECVD, HDP or Spin-On process. The width of the plugs in the plug sublevel is more than 0.4 μm and preferably between 0.4 and 12 um. In one embodiment, the width of the plus is between 0.4 and 4 um. In another embodiment, the width of the plus is between 0.4 and 1 um.

When the vias to be filled by the plugs 306 are etched in the core circuitry region of the column 304 and the lower-level trench to be filled by the lower-level bridge 326 is simultaneously etched in the mechanically strong seal ring structure 324, their window widths differ. Whether wet or dry etch is utilized, the etch rate will vary according to the area exposed in each window that is open to the etch, and also according to the mutual proximity of neighboring windows in a given area, i.e., pattern density. This occurs as a result of depletion of reactants circulating to the etch reaction zone, and also as a result of saturation of reaction products circulating away from the reaction zone. In other words, etch rate is a function of pattern density, and can be expressed as a curve that goes up with the metal width, then saturates, and goes down as the metal width exceeds a certain value. Since the widths of the plug 306 and the lower-level bridge 326 differ, processes sensitive to the pattern density, such as etch back and CMP, need to be adjusted to produce a proper planarized surface.

In order to accommodate the different widths of the plug 306 and the lower-level bridge 326, various manufacturing adjustments are proposed for those pattern-density-dependent processes. Dummy patterns can be selectively implemented to fine tune the pattern density in a CMP process. Avoiding patterning an upper trench metal area and partial plug etching also help adjust the pattern density. As such, the lower-level bridge 326 of the proposed seal ring structure 324 is compatible with the plugs 306 of the core circuit 304 in processes, such as etch back and CMP.

The total metal structure of the stacked bridge 320 on top of the lower-level bridge 326 of the mechanically strong seal ring structure 324 has significantly more top and bottom surface area than prior structures, and therefore it has more adhesion to adjoining layers. The greater solidity of the total stack of such seal ring structures in a multilevel metal IC chip offers greater resistance to the intrusion of cracks. The mechanically strong seal ring structure 324 in FIG. 3 is more massive in the same space as a prior seal ring structure of the column 216 in FIG. 2. Preventing the advance of cracks into the core circuitry of an IC is a great benefit to its reliability.

FIGS. 4A through 4D illustrate layout designs of seal rings, in accordance with various embodiments of the present invention.

Figure 4A:
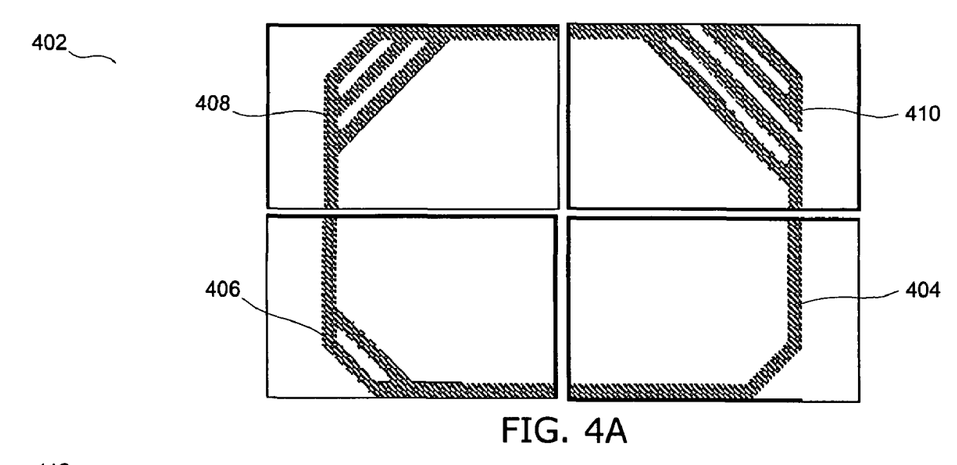
FIGS. 4A-4D illustrate seal ring layout designs, in accordance with various embodiments of the present invention.

In FIG. 4A, all metal line widths of a seal ring are 10 μm. Four different corner designs are illustrated in a plaque 402, joining the straight edge lines. Each of the four different corner designs has a vertical straight edge line 403 and a horizontal edge line 405. A line 404 is a single diagonal line at a corner. A line 406 is a double diagonal line at a corner. A line 408 is a triple diagonal line at a corner. A line 410 is a double diagonal line paralleled by another double line joined as an isolated ring at a corner.

Figure 4B:
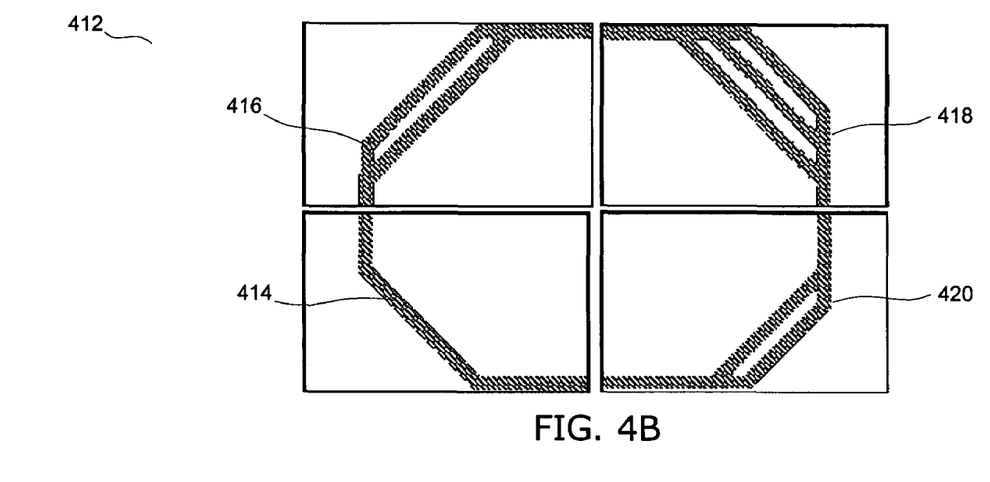

In FIG. 4B, a plaque 412 with four different corner designs shows all metal line widths of a seal ring as 10 μm with corner designs joining the straight edge lines. Each of the four different corner designs has a vertical straight edge line and a horizontal edge line. A line 414 is a single long diagonal line at a corner. A line 416 is a double long diagonal line at a corner. A line 418 is a triple long diagonal line at a corner. A line 420 is a shorter double long diagonal line at a corner.

Figure 4C:
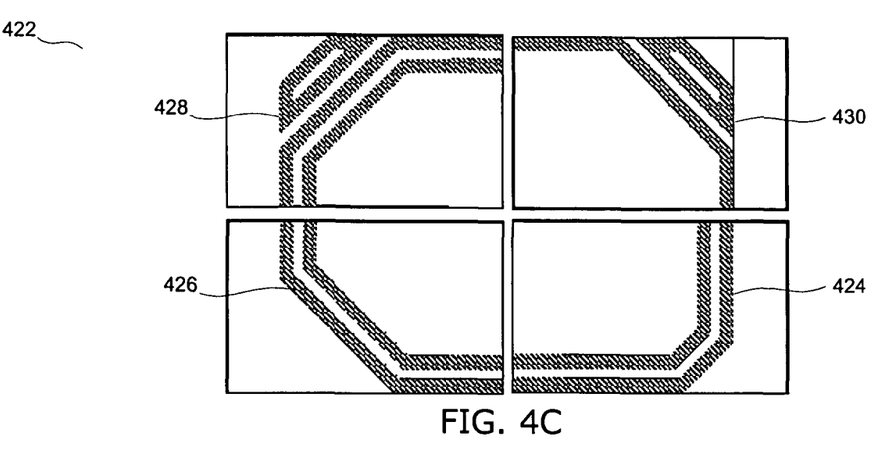

In FIG. 4C, a plaque 422 with four different corner designs shows all metal line widths of a seal ring as 10 μm with corner designs joining the straight edge lines. Each of the four different corner designs has a vertical straight edge line and a horizontal edge line. Lines 424 form a double separated seal ring with short diagonal corner segments. Lines 426 form a double separated seal ring with longer diagonal corner segments. Lines 428 form a double separated seal ring paralleled at the corners by another double line joined as an isolated ring at a corner. Lines 430 form a single seal ring paralleled at the corner by another double line joined as an isolated ring at a corner.

Figure 4D:
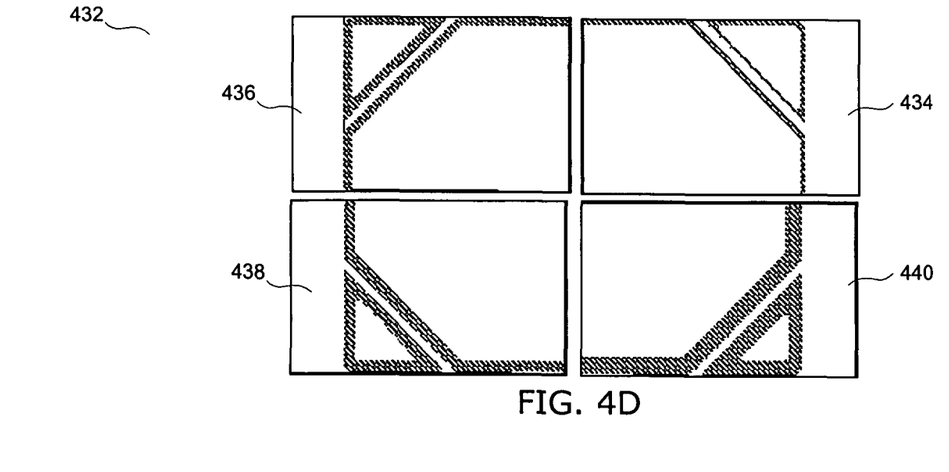

In FIG. 4D, a plaque 432 with four different corner designs shows various metal widths of a seal ring, each with a diagonal corner line joining the straight edge lines. Each of the four different corner designs has a vertical straight edge line and a horizontal edge line. Parallel to the diagonal line, in each case, is another diagonal line joined to straight edge lines joined at the corner as a triangle. Lines 434 are 4 μm wide. Lines 436 are 6 μm wide. Lines 438 are 8 μm wide. Lines 440 are 10 μm wide. FIGS. 4A through 4D show various arrangements of the seal ring. As a general case, the more and thicker the lines, the stronger the protection they provide. Also, the corner region is typically a stress concentrated region that is especially need stronger seal ring design provided by such more and thicker seal ring lines to prevent from advancing micro-cracks. Therefore, a layout design of seal ring with more sing ring line or thicker seal ring width in corner than in vertical edge or horizontal edge of layout is more preferred for the present invention. Alternately, more plugs or large width of plugs in the plug sublevel in corner than in vertical edge and horizontal edge is also more preferred for the present invention.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A seal ring structure for protecting a core circuit region of an integrated circuit chip, comprising:
   a metallization layer having a bridge sublevel and a plug sublevel;
   a metal bridge on the bridge sublevel at a predetermined location between a peripheral edge of the integrated circuit chip and the core circuit region; and
   at least two metal plugs isolated by at least one dielectric structure on the plug sublevel, wherein a total width of the metal plugs is substantially similar to a total width of the dielectric structure, such that the total width of the metal plugs is larger than 50% of that of the metal bridge on the bridge sublevel, and
   wherein the metal bridge and the metal plugs comprise a trench filled with a metallic material and a via formed under the trench.

2. The seal ring structure of claim 1 wherein the total width of the metal plugs on the plug sublevel is between 0.4 and 12 μm.

3. The seal ring structure of claim 1 wherein the total width of the metal plugs on the plug sublevel is between 0.4 and 4 μm.

4. The seal ring structure of claim 1 wherein the total width of the metal plugs on the plug sublevel is between 0.4 and 1 μm.

5. The seal ring structure of claim 1 wherein the metallization layer contains a dielectric material.

6. The seal ring structure of claim 5 wherein the dielectric material has a dielectric constant lower than 3.0.

7. The seal ring structure of claim 5 wherein the dielectric material is a nitrogen containing material.

8. The seal ring structure of claim 5 wherein the dielectric material is an oxygen containing material.

9. The seal ring structure of claim 5 wherein the dielectric material is a carbon containing material.

10. The seal ring structure of claim 5 further comprising a first barrier layer underlying the dielectric material.

11. The seal ring structure of claim 10 wherein the first barrier layer is a nitrogen containing material.

12. The seal ring structure of claim 10 wherein the first barrier layer is an oxygen containing material.

13. The seal ring structure of claim 10 wherein the first barrier layer is a carbon containing material.

14. The seal ring structure of claim 10 further comprising a second barrier layer overlying the dielectric material.

15. The seal ring structure of claim 14 wherein the second barrier layer is a nitrogen containing material.

16. The seal ring structure of claim 14 wherein the second barrier is an carbon containing material.

17. The seal ring structure of claim 1 wherein the metal bridge is made of a copper containing material.

18. A seal ring structure for protecting a core circuit region of an integrated circuit chip, comprising:
 a metallization layer having a bridge sublevel and a plug sublevel;
 a metal bridge on the bridge sublevel at a predetermined location between a peripheral edge of the integrated circuit chip and the core circuit region; and
 at least two metal plugs connected to the same metal bridge and isolated by at least one dielectric structure on the plug sublevel, wherein a total width of the metal plugs is substantially similar to a total width of the dielectric structure, such that the total width of the metal plugs is larger than 50% of that of the metal bridge on the bridge sublevel and
 wherein the metal bridge and the metal plugs comprise a trench filled with a metallic material and via holes underlying the trench,
 wherein widths of the at least two metal plugs on the plug sublevel are substantially greater than those of metal plugs formed in the core circuit region.

19. The seal ring structure of claim 18 wherein widths of the at least two metal plugs on the plug sublevel are between 0.4 and 12 μm.

20. The seal ring structure of claim 18 wherein the widths of the at least two metal plugs on the plug sublevel are between 0.4 and 4 μm.

21. The seal ring structure of claim 18 wherein the widths of the at least two metal plugs on the plug sublevel are between 0.4 and 1 μm.

22. The seal ring structure of claim 18 wherein the dielectric structure contains a dielectric material with a dielectric constant lower than 3.0.

23. The seal ring structure of claim 22 wherein the dielectric material is a nitrogen containing material.

24. The seal ring structure of claim 22 wherein the dielectric material is an oxygen containing material.

25. The seal ring structure of claim 22 wherein the dielectric material is a carbon containing material.

26. The seal ring structure of claim 18 further comprising a first barrier layer underlying the dielectric structure.

27. The seal ring structure of claim 26 wherein the first barrier layer is a nitrogen containing material.

28. The seal ring structure of claim 26 wherein the first barrier layer is an oxygen containing material.

29. The seal ring structure of claim 26 wherein the first barrier layer is a carbon containing material.

30. The seal ring structure of claim 18 further comprising a second barrier layer overlying the dielectric layer.

31. The seal ring structure of claim 30 wherein the second barrier layer is a nitrogen containing material.

32. The seal ring structure of claim 30 wherein the second barrier is an oxygen containing material.

33. The seal ring structure of claim 18 wherein the bridge is made of a copper containing material.

34. The seal ring structure of claim 18 further comprising a second metal bridge on the bridge sublevel.

35. The seal ring structure of claim 18 further comprising a second seal ring structure between the peripheral edge of the integrated circuit chip and the core circuit region.

36. A seal ring structure for protecting a core circuit region of an integrated circuit chip, comprising:
 a metallization layer having a bridge sublevel and a plug sublevel;
 a metal bridge on the bridge sublevel at a predetermined location between a peripheral edge of the integrated circuit chip and the core circuit region; and
 at least two metal plugs isolated by at least one dielectric structure on the plug sublevel, wherein a total width of the metal plugs is substantially similar to a total width of the dielectric structure, such that the total width of the metal plugs is larger than 50% of that of the metal bridge on the bridge sublevel, and
 wherein the metal bridge and the metal plugs comprise a trench filled with a metallic material and via holes underlying the trench,
 wherein widths of the at least two metal plugs on the plug sublevel are substantially greater than those of metal plugs formed in the core circuit region.

37. The seal ring structure of claim 36 wherein widths of the at least two metal plugs on the plug sublevel are between 0.4 and 12 μm.

38. The seal ring structure of claim 36 wherein the widths of the at least two metal plugs on the plug sublevel are between 0.4 and 4 μm.

39. The seal ring structure of claim 36 wherein the widths of the at least two metal plugs on the plug sublevel are between 0.4 and 1 μm.

40. The seal ring structure of claim 36 further comprising at least one dielectric structure contains dielectric material with a dielectric constant lower than 3.0.

41. The seal ring structure of claim 40 wherein the dielectric material is a nitrogen containing material.

42. The seal ring structure of claim 40 wherein the dielectric material is an oxygen containing material.

43. The seal ring structure of claim 40 wherein the dielectric material is a carbon containing material.

44. The seal ring structure of claim 40 further comprising a first barrier layer underlying the dielectric structure.

45. The seal ring structure of claim 40 further comprising a second barrier layer overlying the dielectric layer.

46. A seal ring structure for protecting a core circuit region of an integrated circuit chip from advance of cracks, the seal ring structure comprising:
- a first set of one or more seal ring lines at a corner region between a corner of the integrated circuit chip and the core circuit region; and
- a second set of one or more seal ring lines at edge region between an edge of the integrated circuit chip and the core circuit region, wherein each of the seal ring lines further comprises:
- a metallization layer having a metal bridge on a bridge sublevel and at least one metal plug on a plug sublevel;
- a metal bridge on the bridge sublevel at a predetermined location between a peripheral edge of the integrated circuit chip and the core circuit region; and
- at least two metal plugs isolated by at least one dielectric structure on the plug sublevel, wherein a total width of the metal plugs is substantially similar to a total width of the dielectric structure, such that the total width of the metal plugs is larger than 50% of that of the metal bridge on the bridge sublevel, and
- wherein the metal bridge and the metal plugs comprise a trench filled with a metallic material and via holes underlying the trench,
- wherein a width of the metal plugs on the plug sublevel is greater than that of a metal plug formed in the core circuit region.

47. The seal ring structure of claim 46 wherein the first set of seal ring lines comprises at least two seal ring lines.

48. The seal ring structure of claim 46 wherein the second set of seal ring lines comprises at least one seal ring line.

49. The seal ring structure of claim 46 wherein the first set of seal ring lines comprises a seal ring not electrically connecting to the remaining seal ring of the first number of seal ring lines.

50. The seal ring structure of claim 46 wherein the first set of seal ring lines comprises a seal ring not electrically connecting to the second number of seal ring.

* * * * *